United States Patent
Chen et al.

(10) Patent No.: US 6,441,496 B1
(45) Date of Patent: Aug. 27, 2002

(54) STRUCTURE OF STACKED INTEGRATED CIRCUITS

(76) Inventors: Wen Chuan Chen, No. 84, Taiho Road, Chupei, Hsinchu Hsien (TW); Kuo Feng Peng, No. 84, Taiho Road, Chupei, Hsinchu Hsien (TW); Jichen Wu, No. 84, Taiho Road, Chupei, Hsinchu Hsien (TW); Chia Jung Chang, No. 84, Taiho Road, Chupei, Hsinchu Hsien (TW)

(*) Notice: Subject to any disclaimer, the term of this patent is extended or adjusted under 35 U.S.C. 154(b) by 0 days.

(21) Appl. No.: 09/768,987

(22) Filed: Jan. 23, 2001

(51) Int. Cl.⁷ .............................................. H01L 23/495
(52) U.S. Cl. ...................... 257/777; 257/686; 257/723; 257/783
(58) Field of Search ............................... 257/777, 723, 257/685, 686, 783

(56) References Cited

U.S. PATENT DOCUMENTS 6,097,097 A * 1/2000 Hirose ......................... 257/778
6,333,562 B1 * 12/2001 Lin .............................. 257/777

* cited by examiner

Primary Examiner—Roy Potter
(74) Attorney, Agent, or Firm—Pro-Techtor International Services

(57) ABSTRACT

The structure of stacked integrated circuits includes a substrate, a lower integrated circuit, a plurality of wirings, an adhesive layer, and an upper integrated circuit. The substrate has a first surface formed with signal input terminals, and a second surface formed with signal output terminals. The lower integrated circuit has a first surface and a second surface. The first surface is adhered to the first surface of the substrate while the second surface is formed with a plurality of bonding pads. The wirings have first ends and second ends. The first ends are electrically connected to the bonding pads of the lower integrated circuit while the second ends are electrically connected to the signal input terminals of the substrate. The adhesive layer is coated on the second surface of the lower integrated circuit and includes adhesive agent and filling elements. The upper integrated circuit is stacked above the second surface of the lower integrated circuit with the adhesive layer inserted between the upper and lower integrated circuit. The lower integrated circuit is adhered to the upper integrated circuit by the adhesive agent. A predetermined gap is formed between the lower and upper integrated circuit by the filling elements. According to this structure, the wirings located under the lower integrated circuit are free from being pressed and damaged by the upper integrated circuit when stacking a plurality of integrated circuits. Thus, the stacking processes can be facilitated and the manufacturing costs can also be lowered.

6 Claims, 1 Drawing Sheet

STRUCTURE OF STACKED INTEGRATED CIRCUITS

BACKGROUND OF THE INVENTION

1. Field of the Invention

The invention relates to a structure of stacked integrated circuits and method for manufacturing the same, in particular, to a structure of stacked integrated circuits in which integrated circuits can be effectively stacked so as to facilitate the manufacturing processes.

2. Description of the Related Art

In the current technological field, every product needs to be light, thin, and small. Therefore, it is preferable that the integrated circuit has a small volume in order to meet the demands of the products. In the prior art, even if the volumes of integrated circuits are small, they only can be electrically connected to the circuit board in parallel. Because the area of the circuit board is limited, it is not possible to increase the number of the integrated circuits mounted on the circuit board. Therefore, it is difficult to make the products small, thin, and light.

To meet the demands of manufacturing small, thin, and light products, a lot of integrated circuits can Se stacked. However, when stacking a lot of integrated circuits. the upper integrated circuit will contact and press the wirings of the lower integrated circuit. In this case, the signal transmission to or from the lower integrated circuit is easily influenced.

Referring to FIG. 1, a structure of stacked integrated circuits includes a substrate 10, a lower integrated circuit 12, an upper integrated circuit 14, a plurality of wirings 16 and 17, and an isolation layer 18. The lower integrated circuit 12 is located on the substrate 10. The isolation layer 18 is located on the lower integrated circuit 12. The upper integrated circuit 14 is stacked on the isolation layer 18. That is, the upper integrated circuit 14 is stacked above the lower integrated circuit 12 with the isolation layer 18 interposed between the integrated circuits 12 and 14. Thus, a proper gap 20 is formed between the lower integrated circuit 12 and the upper integrated circuit 14. According to this structure, the plurality of wirings 17 can be electrically connected to the edge of the lower integrated circuit 12. Furthermore, the plurality of wirings 17 connecting the substrate 10 to the lower integrated circuit 12 are free from being pressed when stacking the upper integrated circuit 14 above the lower integrated circuit 12.

However, the above-mentioned structure has the disadvantages described hereinbelow. During the manufacturing processes, the isolation layer 18 has to be manufactured in advance, and then, it is adhered to the lower integrated circuit 12. Thereafter, the upper integrated circuit 14 has to be adhered on the isolation layer 18. As a result, the manufacturing processes are complicated, and the manufacturing costs are high.

To solve the above-mentioned problems, it is necessary for the invention to provide a structure of stacked integrated circuits in order to improve the stacking processes of the integrated circuits, facilitate the manufacturing processes. and lower down the manufacturing costs.

SUMMARY OF THE INVENTION

It is therefore an object of the invention to provide a structure of stacked integrated circuits and method for manufacturing the same in order to effectively stack the integrated circuits and increase the manufacturing speed.

It is therefore another object of the invention to provide a structure of stacked integrated circuits and method for manufacturing the same in which the stacking processes can be simplified because an isolation layer can be simultaneously formed on the integrated circuit when coating the adhesive layer.

It is therefore still another object of the invention to provide a structure of stacked integrated circuits and method for manufacturing the same in which the adhesive layer and isolation layer can be formed simultaneously by a general coater. Thus, no other apparatus should be prepared for manufacturing the stacked integrated circuits.

According to one aspect of the invention, a structure of stacked integrated circuits includes a substrate, a lower integrated circuit, a plurality of wirings, an adhesive layer, and an upper integrated circuit. The substrate has a first surface formed with signal input terminals, and a second surface formed with signal output terminals. The lower integrated circuit has a first surface and a second surface. The first surface of the lower integrated circuit is adhered to the first surface of the substrate while the second surface of the lower integrated circuit is formed with a plurality of bonding pads. The wirings have first ends and second ends. The first ends are electrically connected to the bonding pads of the lower integrated circuit while the second ends are electrically connected to the signal input terminals of the substrate. The adhesive layer is coated on the second surface of the lower integrated circuit and includes adhesive agent and filling elements. The upper integrated circuit is stacked above the second surface of the lower integrated circuit with the adhesive layer inserted between the upper and lower integrated circuits. The lower integrated circuit is adhered to the upper integrated circuit by the adhesive agent. A predetermined gap is formed between the lower and upper integrated circuits by the filling elements.

According to this structure, the lower integrated circuit is free from being pressed and damaged by the upper integrated circuit when stacking a plurality of integrated circuits. Thus, the stacking processes can be facilitated and the manufacturing costs can also be lowered.

DETAIL DESCRIPTION OF THE INVENTION

Figure 1:
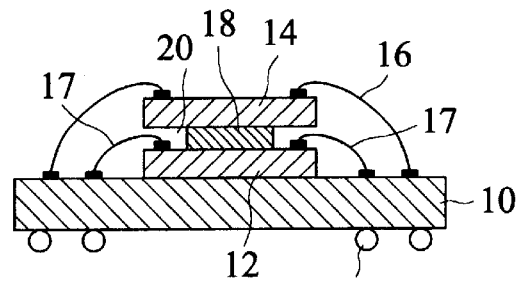
FIG. 1 is a cross-sectional view showing a conventional structure of stacked integrated circuits.
Figure 2:
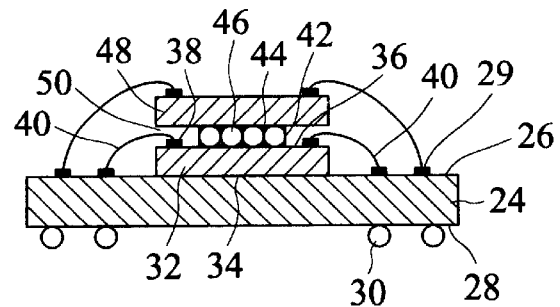
FIG. 2 is a cross-sectional view showing a structure of stacked integrated circuits in accordance one embodiment of the invention.

Referring to FIG. 2, the structure of stacked integrated circuits according to the invention includes a substrate 24, a lower integrated circuit 32, a plurality of wirings 40, an adhesive layer 42, and an upper integrated circuit 48.

The substrate 24 has a first surface 26 and a second surface 28. The first surface 26 is formed with signal input terminals 29 for transmitting the signals from the integrated circuit to the substrate 24. The second surface 29 is formed with signal output terminals 30 for transmitting the signals from the integrated circuit to the circuit board (not shown). The signal output terminals 30 can be connected to a plurality of metallic balls 30 arranged in the form of a ball grid array (BGA).

The lower integrated circuit 32 has a first surface 34 and a second surface 36. The first surface 34 is adhered onto the first surface 26 of the substrate 24. The second surface 36 is formed with a plurality of bonding pads 38 for electrically connecting to the substrate 24.

First ends of the plurality of wirings 40 are electrically connected to the bonding pads 38 of then lower integrated circuit 32, while second ends of the plurality of wirings 40 a re electrically connected to the signal input terminals 29 of the substrate 24, respectively. Thus, the signals from the lower integrated circuit 32 can be transmitted to the substrate 24.

Figure 3:
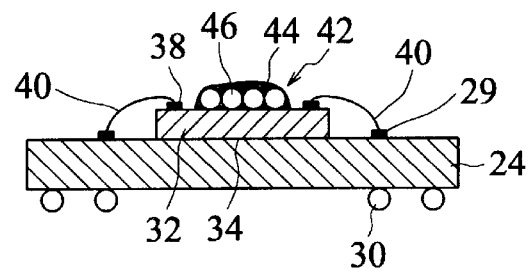
FIG. 3 is a schematic illustration showing the structure of stacked integrated circuits of the invention.

The adhesive layer 42 is coated on the second surface 36 of the lower integrated circuit 32. The adhesive layer 42 consists of adhesive agent 44 and filling elements 46. The adhesive agent 44 and the filling elements 46 are mixed together and can be coated onto the second surfaced 36 of the lower integrated circuit 32 using a general coater. The adhesive layer ,42 is unevenly coated on the second surface 36 of the lower integrated circuit 32, as shown in FIG. 3.

Referring again to FIG. 2, the upper integrated circuit 48 is stacked on the second surface 36 of the lower integrated circuit 32 and is bonded or adhered to the lower integrated circuit 32 by the adhesive agent 44. At this time, the uneven adhesive layer 42 is pressed and flattened. A gap 50 is formed between the lower integrated circuit 32 and the upper integrated circuit 48 by using the filling elements 46. The bonding pads 38 to which the plurality of wirings 40 connect to are located within the gap 50. The wirings 40 may be connected to the lower integrated circuit 32 by way of, for example, wedge bonding. Thus, the wirings 40 is free from being pressed by the upper integrated circuit 48 when stacking the upper integrated circuit 48 above the lower integrated circuit 32. In this embodiment, the adhesive layer is coated on the central portion of the second surface of the lower integrated circuit.

Figure 4:
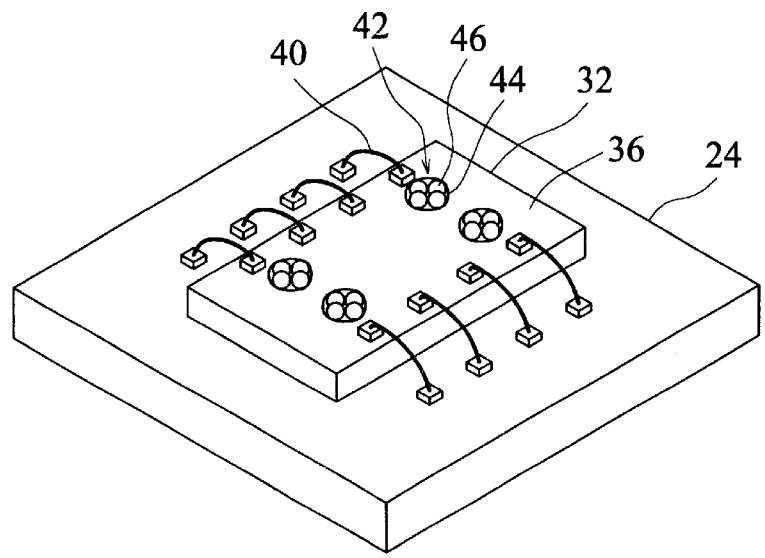
FIG. 4 is a schematic illustration showing the structure of stacked integrated circuits in accordance with another embodiment of the invention.

Referring to FIG. 4, the adhesive layer 42 may also be coated at the periphery or four comers or periphery of the second surface 36 of the lower integrated circuit 32. In this case, a stable contact surface between the upper integrated circuit 48 and the lower integrated circuit 32 can be obtained.

The structure of the stacked integrated circuits of the invention and method for manufacturing the same have the following advantages.

1. A gap 50 between the upper integrated circuit 48 and the lower integrated circuit 32 can be easily formed by using the adhesive layer 42 consisting of the adhesive agent 44 and the filling element 46. Thus, the wirings 40 located inside the gap 50 is free from being pressed and damaged by the upper integrated circuit 48.

2. The stacking processes can be simplified by coating the adhesive agent 44 and the filling element 46 onto the lower integrated circuit 32 at the same time.

3. The manufacturing costs can be lowered because the adhesive layer 42 can be coated by a general coater. The apparatus for bonding the isolation layer 18 is no longer needed.

While the invention has been described by way of example and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A structure of stacked integrated circuits, comprising:

a substrate having a first surface formed with signal input terminals, and a second surface formed with signal output terminals;

a lower integrated circuit having a first surface and a second surface, the first surface of the lower integrated circuit being adhered to the first surface of the substrate, the second surface of the lower integrated circuit being formed with a plurality of bonding pads;

a plurality of wirings having first ends and second ends, the first ends being electrically connected to the bonding pads of the lower integrated circuit and the second ends being electrically connected to the signal input terminals of the substrate;

an adhesive layer coated on the second surface of the lower integrated circuit, the adhesive layer including adhesive agent and filling elements; and an upper integrated circuit stacked above the second surface of the lower integrated circuit with the adhesive layer inserted between the upper and lower integrated circuits, wherein the lower integrated circuit is adhered to the upper integrated circuit by the adhesive agent, and a predetermined gap is formed between the lower and upper integrated circuits by the filling elements.

2. The structure of stacked integrated circuits according to claim 1, wherein the signal output terminals of the substrate are metallic balls arranged in the form of a ball grid array (BGA).

3. The structure of stacked integrated circuits according to claim 1, wherein the plurality of wirings are electrically connected to an edge of the second surface of the lower integrated circuit.

4. The structure of stacked integrated circuits according to claim 3, wherein the plurality of wirings are electrically connected to the lower integrated circuit by way of wedge bonding.

5. The structure of stacked integrated circuits according to claim 1, wherein the adhesive layer is coated on the central portion of the second surface of the lower integrated circuit.

6. The structure of stacked integrated circuits according to claim 1, wherein the adhesive layer is coated on the periphery of the second surface of the lower integrated circuit.

* * * * *

(12) INTER PARTES REEXAMINATION CERTIFICATE (0228th)
United States Patent
Chen et al.

(10) Number: US 6,441,496 C1
(45) Certificate Issued: Feb. 8, 2011

(54) STRUCTURE OF STACKED INTEGRATED CIRCUITS

(75) Inventors: Wen Chuan Chen, Hsinchu Hsien (TW); Kuo Feng Peng, Hsinchu Hsien (TW); Jichen Wu, Hsinchu Hsien (TW); Chia Jung Chang, Hsinchu Hsien (TW)

(73) Assignee: Kingpak Technology Inc., Chupei, Hsinchu Hsien (TW)

Reexamination Request:
No. 95/000,126, Jan. 25, 2006

Reexamination Certificate for:
Patent No.: 6,441,496
Issued: Aug. 27, 2002
Appl. No.: 09/768,987
Filed: Jan. 23, 2001

(51) Int. Cl.
*H01L 21/58* (2006.01)
*H01L 25/065* (2006.01)
*H01L 21/02* (2006.01)

(52) U.S. Cl. .................. 257/777; 257/686; 257/723; 257/783; 257/E21.505; 257/E25.013

(58) Field of Classification Search .................. None
See application file for complete search history.

(56) References Cited

U.S. PATENT DOCUMENTS

| | | | |
|---|---|---|---|
| 3,655,482 A | | 4/1972 | Schildkraut et al. |
| 4,765,526 A | | 8/1988 | Sato |
| 5,232,962 A | | 8/1993 | Dershem et al. |
| 5,291,061 A | | 3/1994 | Ball |
| 5,891,761 A | * | 4/1999 | Vindasius et al. ............ 438/109 |
| 6,133,637 A | * | 10/2000 | Hikita et al. ................. 257/777 |
| 6,271,598 B1 | * | 8/2001 | Vindasius et al. ........... 257/777 |
| 6,333,562 B1 | | 12/2001 | Lin |
| 6,472,758 B1 | * | 10/2002 | Glenn et al. ................. 257/777 |
| 6,593,662 B1 | | 7/2003 | Pu et al. |

FOREIGN PATENT DOCUMENTS

WO    WO 98/33217    *    7/1998

OTHER PUBLICATIONS

NASA Goddard Space Flight Center article on the basics of wire bonding at URL: http://nepp.nasa.gov/wirebond/Basic%20Info.htm.*
Wolf, et al. Silicon Processing for the VLSI Era, vol. 1—Process Technology, 2nd ed., Lattice Press: Sunset Beach, CA, 2000, pp. 863–869.*
Definition of "admixture" from URL: http:www.dictionary.com.*

* cited by examiner

*Primary Examiner*—Erik Kielin

(57) ABSTRACT

The structure of stacked integrated circuits includes a substrate, a lower integrated circuit, a plurality of wirings, an adhesive layer, and an upper integrated circuit. The substrate has a first surface formed with signal input terminals, and a second surface formed with signal output terminals. The lower integrated circuit has a first surface and a second surface. The first surface is adhered to the first surface of the substrate while the second surface is formed with a plurality of bonding pads. The wirings have first ends and second ends. The first ends are electrically connected to the bonding pads of the lower integrated circuit while the second ends are electrically connected to the signal input terminals of the substrate. The adhesive layer is coated on the second surface of the lower integrated circuit and includes adhesive agent and filling elements. The upper integrated circuit is stacked above the second surface of the lower integrated circuit with the adhesive layer inserted between the upper and lower integrated circuit. The lower integrated circuit is adhered to the upper integrated circuit by the adhesive agent. A predetermined gap is formed between the lower and upper integrated circuit by the filling elements. According to this structure, the wirings located under the lower integrated circuit are free from being pressed and damaged by the upper integrated circuit when stacking a plurality of integrated circuits. Thus, the stacking processes can be facilitated and the manufacturing costs can also be lowered.

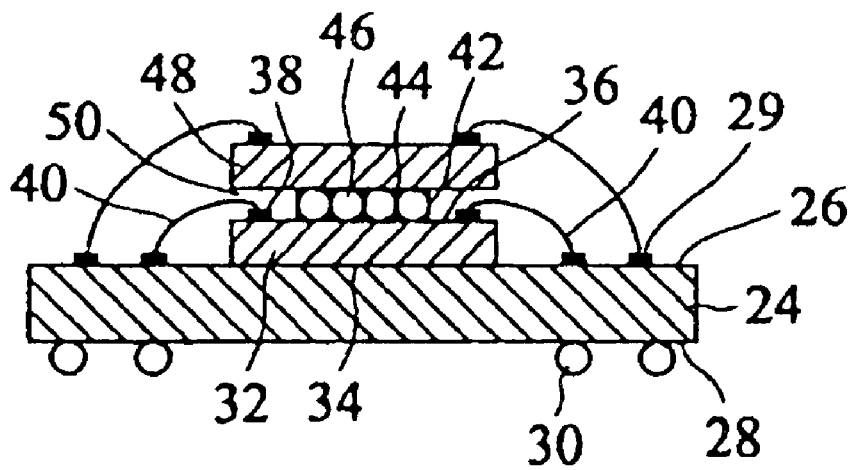

INTER PARTES REEXAMINATION CERTIFICATE ISSUED UNDER 35 U.S.C. 316

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 3, lines 24-39:

Referring again to FIG. 2, the upper integrated circuit 48 is stacked on the second surface 36 of the lower integrated circuit 32 and is bonded or adhered to the lower integrated circuit 32 by the adhesive agent 44. At this time, the uneven adhesive layer 42 is pressed and flattened. A gap 50 is formed between the lower integrated circuit 32 and the upper integrated circuit 48 by using the filling elements 46. The bonding pads 38 to which the plurality of wiring 40 connect to are located within the gap 50. The wirings 40 may be connected to the lower integrated circuit 32 by way of, for example, wedge [bonding] *bonds*. Thus, the wirings 40 is free from being pressed by the upper integrated circuit 48 when stacking the upper integrated circuit 48 above the lower integrated circuit 32. In this embodiment, the adhesive layer is coated on the central portion of the second surface of the lower integrated circuit.

AS A RESULT OF REEXAMINATION, IT HAS BEEN DETERMINED THAT:

Claims 1-6 are cancelled.

\* \* \* \* \*